United States Patent

Nakos et al.

[11] Patent Number: 6,054,745
[45] Date of Patent: Apr. 25, 2000

[54] NONVOLATILE MEMORY CELL USING MICROELECTROMECHANICAL DEVICE

[75] Inventors: James S. Nakos; Richard Q. Williams, both of Essex Junction, Vt.

[73] Assignee: International Business Machines Corporation, Armonk, N.Y.

[21] Appl. No.: 09/225,071

[22] Filed: Jan. 4, 1999

[51] Int. Cl.[7] ................................................. H01L 29/72
[52] U.S. Cl. ...................... 257/415; 257/296; 257/347; 257/350; 257/401; 438/52
[58] Field of Search ..................................... 257/296, 347, 257/350, 415, 401; 438/52

[56] References Cited

U.S. PATENT DOCUMENTS

| | | |
|---|---|---|
| 4,356,730 | 11/1982 | Cade . |
| 4,979,149 | 12/1990 | Popovic et al. ......................... 257/415 |
| 5,103,279 | 4/1992 | Gutteridge . |
| 5,262,000 | 11/1993 | Welbourn et al. . |
| 5,454,904 | 10/1995 | Ghezzo et al. . |
| 5,472,539 | 12/1995 | Saia et al. . |
| 5,536,963 | 7/1996 | Polla . |
| 5,538,753 | 7/1996 | Antes et al. . |
| 5,637,904 | 6/1997 | Zettler . |
| 5,638,946 | 6/1997 | Zavracky . |
| 5,677,823 | 10/1997 | Smith ...................................... 257/415 |

OTHER PUBLICATIONS

Halg, IEEE Proc of Microelectromechanical Systems, pp. 171–176, Jan. 1990.
"On a Nonvolatile Memory Cell Based on Micro–Electro–Mechanics," B. Hälg, *IEEE Proc, Of Microelectromechanical Systems*, 1990. p. 172–176.

*Primary Examiner*—Edward Wojciechowicz
*Attorney, Agent, or Firm*—DeLio & Peterson, LLC; Peter W. Peterson; Eugene I. Shkurko

[57] ABSTRACT

A nonvolatile memory cell comprises a conductive cantilever beam having a free end in a first charge state, a first FET having a conductive gate in a second charge state and a pull-in electrode adapted to bring the cantilever beam into electrical contact with the gate to effect a charge state change in the gate. A pull-in electrode input is connected to the electrode, a cantilever input is connected to the cantilever, a column select input is connected to the first FET and a row select input is connected to the first FET. The nonvolatile memory cell is selected by signals applied to the row select input and the column select input. The cell also includes a second FET connected between the cantilever beam and the cantilever input for controlling the passage of signals from the cantilever input to the cantilever beam and a third FET connected between the pull-in electrode and the pull-in electrode input for controlling the passage of signals from the pull-in electrode input to the electrode. The second FET and third FET have gates connected to the row select input. The row select input turns on the second FET and the third FET to allow the passage of signals from the pull-in electrode input to the pull-in electrode and from the cantilever input to the cantilever beam when the nonvolatile memory cell is selected.

31 Claims, 7 Drawing Sheets

NONVOLATILE MEMORY CELL USING MICROELECTROMECHANICAL DEVICE

BACKGROUND OF THE INVENTION

1. Field of the Invention

This invention relates generally to microelectromechanical devices used in electronic circuits and is directed in particular to a nonvolatile memory cell using an integrated microelectromechanical device made by a photolithographic process.

2. Description of Related Art

Conventional nonvolatile VLSI memory technologies use a dual polysilicon process consisting of a stacked control gate and a floating gate over a MOSFET (metal oxide semiconductor field effect transistor) channel. Under the proper voltage conditions, the floating gate becomes charged with carriers that have tunneled through the oxide from the MOSFET channel. This charge alters the device threshold enough to be electrically sensed. The level of the charge corresponds to either a 0 or 1 signal so that the device can be used as a memory cell in, for example, random access memory in a computer.

Dual polysilicon device designs can suffer from the need for extra high voltage power supplies and from gate oxide stress degradation. Tunneling currents are usually low, so write/erase times, even though infrequent, are long compared to other solid state memory technologies.

Accordingly, there has been a need in the prior art for a nonvolatile memory cell which is not susceptible to gate oxide degradation. Furthermore, it would be advantageous for such a cell to be able to use a single power supply and be designed to operate at low voltages. Such a memory cell should have faster write times, support write/verify functions and have retention times comparable to conventional NVRAM cells.

Hälg, in the article "On a Nonvolatile Memory Cell Based on Micro-Electro-Mechanics" *IEEE PROC. OF MICRO-ELECTROMECHANICAL SYSTEMS*, 1990, p. 172, discloses a surface micro-machined bridge which is logitudinally stressed so that it buckles and becomes mechanically bistable, and performs the memory function. Read and write operations are performed by sensing the capacitance of the bridge and by electrostatically switching the bridge from one stable state into the other.

Other micro-mechanical devices have been suggested for various uses but not been disclosed or suggested for use as nonvolatile memory cells. For example, U.S. Pat. No. 5,638,946 discloses a micro-mechanical switch which may be utilized in logic gates such as NAND gates, NOR gates and inverters and/or as a memory element. However, the switch utilizes an insulated cantilever beam and provides no storage means within the switch device.

U.S. Pat. No. 5,472,539 also discloses a micromechanical switch with a pull-down electrode and a cantilever beam, but makes no disclosure or suggestion of such a switch as a memory cell.

U.S. Pat. No. 5,262,000 discloses a method of fabricating a microelectromechanical switch with a beam of polysilicon with a pull-down electrode but discloses no memory cell which may be made from such a device.

U.S. Pat. No. 5,103,279 discloses a microelectromechanical sensor having a field effect transistor formed in a portion of a substrate which may be used as a pressure and acceleration sensor. Again, no use of a memory cell is disclosed or suggested. Other microelectromechanical switches are disclosed in U.S. Pat. Nos. 5,637,904, 5,536,963, 5,454,904, 4,979,149, 4,356,730, 5,677,823, and 5,538,753.

Bearing in mind the problems and deficiencies of the prior art, it is therefore an object of the present invention to provide an improved nonvolatile memory cell which is not susceptible to gate oxide degradation.

It is another object of the present invention to provide a nonvolatile memory cell which may use a single power supply and can operate at low voltages if desired.

It is yet another object of the present invention to provide a nonvolatile memory cell which has faster write times than conventional nonvolatile memory cells.

It is a further object of the present invention to provide a nonvolatile memory cell which has retention times comparable to conventional nonvolatile memory cells.

It is yet another object of the present invention to provide a nonvolatile memory cell which can support write/verify functions.

Still other objects and advantages of the invention will in part be obvious and will in part be apparent from the specification.

SUMMARY OF THE INVENTION

The above and other objects, which will be apparent to those skilled in the art, are achieved in the present invention which relates to a nonvolatile memory cell comprising an insulating layer fabricated on a silicon substrate and an electrically conductive cantilever on the insulating layer, the cantilever supported near a first end thereof and having a second end thereof free for movement. An electrical conductor is in contact with the cantilever near the first end. The cell further includes a contact region on the substrate near the second end of the cantilever. Said contact region is adapted to receive and store a charge therein when contacted by the second end of the cantilever.

The nonvolatile memory cell may further include an electrode on the insulating layer for causing the cantilever second end to contact the contact region and sensing means near the contact region for sensing a charge state of the contact region. Preferably, the insulating layer comprises silicon dioxide and the sensing means includes a field-effect transistor, such as an n-channel field effect transistor, and the contact region is adapted to act as a gate for the field-effect transistor (FET).

The nonvolatile memory cell may further include a protective layer, preferably comprising silicon nitride, over the insulating layer covering the cantilever and the contact region. Said electrical conductor may comprise a support for the cantilever.

In another aspect, the present invention provides a nonvolatile memory cell comprising a first conductive element in a first charge state, a second conductive element in a second charge state and means for bringing the first and second conductive elements into electrical contact to effect a charge state change in one of the first and second conductive elements. The cell also includes means for sensing the charge state in the one of the first and second conductive elements. Preferably, the first conductive element comprises a cantilever beam and the second conductive element comprises a FET gate. The means for bringing the first and second conductive elements into electrical contact to effect a charge state change may comprise an electrode which applies an electrostatic attractive force to the first conductive element and the means for sensing the charge state may comprise a FET. Preferably, the memory cell is fabricated on an insulating layer that can be fabricated on a substrate such as a silicon wafer. A protective layer of silicon nitride may be provided over the insulating layer covering the first and second conductive elements.

In a further aspect, the present invention provides a nonvolatile memory cell comprising a conductive cantilever beam having a free end in a first charge state, a sensing element such as an FET having a conductive gate in a second charge state, the sensing element adapted to sense the charge state in the gate, and an electrode adapted to bring the cantilever beam into electrical contact with the gate to effect a charge state change in the gate. The cantilever beam is preferably electrically conductive polysilicon over its entire length and a polysilicon electrode is adapted to apply an electrostatic attractive force to the cantilever beam. The cell may further include a protective layer of silicon nitride over the insulating layer covering the cantilever beam, electrode and FET.

In a related aspect, the present invention provides a method of creating and sensing a charge state in a nonvolatile memory cell comprising providing a first conductive element in a first charge state and providing a second conductive element in a second charge state. The first and second conductive elements are electrically contacted to effect a charge state change in one of the first and second conductive elements. The charge state is sensed in the one of the first and second conductive elements.

In yet another aspect, the present invention relates to a process for fabricating a nonvolatile memory cell comprising providing an insulating layer on a substrate and creating or depositing on the substrate a FET, a support and an electrode. (The electrode may be created between the FET and support, or the FET may be created between the electrode and support.) A removable layer is deposited over the FET, support and electrode and an electrically conductive layer is deposited over the removable, nonconductive layer in contact with the support. Thereafter, the removable layer is removed such that the electrically conductive layer comprises a cantilever supported by the support and having a movable free end over the FET. Said FET is adapted to receive and store a charge therein when the FET is at a predetermined potential and a bias is applied to the electrode to pull the cantilever toward the electrode to cause the free end of the cantilever to contact the FET.

Another aspect of the present invention provides a nonvolatile memory cell comprising a conductive cantilever beam having a free end in a first charge state, a first sensing element or FET having a conductive gate in a second charge state and an electrode, also called the pull-in electrode, adapted to bring the cantilever beam into electrical contact with the gate to effect a charge state change in the gate. A pull-in electrode input is connected to the pull-in electrode, a cantilever input is connected to the cantilever, a column select input is connected to the first sensing element or FET and a row select input is connected to the first sensing element or FET. The nonvolatile memory cell is selected by signals applied to the row select input and the column select input. The cell also includes a second sensing element or FET connected between the cantilever beam and the cantilever input for controlling the passage of signals from the cantilever input to the cantilever beam and a third sensing element or FET connected between the pull-in electrode and the pull-in electrode input for controlling the passage of signals from the pull-in electrode input to the pull-in electrode.

Preferably, the second FET and third FET have gates connected to the row select input. The row select input turns on the second FET and the third FET to allow the passage of signals from the pull-in electrode input to the pull-in electrode and from the cantilever input to the cantilever beam when the nonvolatile memory cell is selected.

A one is written to the cell when the cantilever electrode is at a one bias and the pull-down electrode is at a zero bias, and a zero is written to the cell when the cantilever electrode is at a zero bias and the pull-down electrode is at a high bias.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
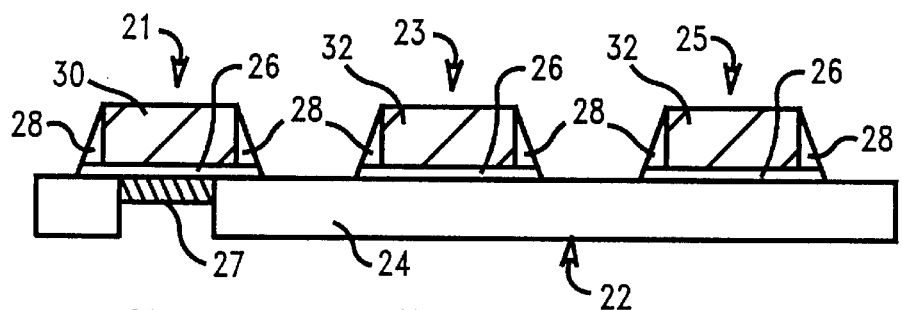
FIGS. 1, 3, 5, 7, 9, 11 and 13 are elevated sectional views of steps in the photolithographic fabrication process for the nonvolatile memory cell of the present invention.
Figure 2:
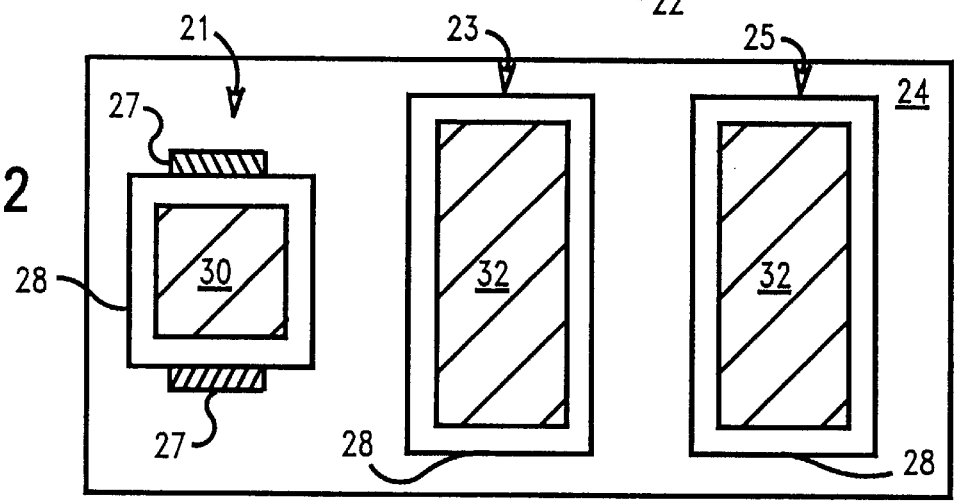
FIGS. 2, 4, 6, 8, 10, 12 and 14 are plan views of the portion of the nonvolatile memory cell of the present invention shown in FIGS. 1, 3, 5, 7, 9, 11 and 13, respectively.

In describing the preferred embodiment of the present invention, reference will be made herein to FIGS. 1–20 of the drawings in which like numerals refer to like features of the invention. Features of the invention are not necessarily shown to scale in the drawings.

The present invention is directed to a nonvolatile memory cell structure which consists of a microelectromechanical switch which utilizes an electrostatic pull-in electrode to actuate the switch and an otherwise conventional MOSFET as a storage device. When the pull-in voltage is high enough, the switch arm is pulled closed, causing a charge to be deposited on the MOSFET gate. The gate is electrically isolated similar to the floating gate of a conventional NVRAM (nonvolatile random access memory) cell and is therefore nonvolatile. The amount of stored charge is electrically sensed by measuring the source-drain current through the MOSFET. The invention as described uses an n-channel FET although it could also be applied to other types such as p-channel.

The fabrication process for the microelectromechanical switch is shown in FIGS. 1–14. As shown in FIG. 1, a conventional shallow trench isolation (STI) structure 24 formed in a silicon substrate 22 carries on it FET sensing element 21, a pull-in electrode 23 and a cantilever support 25. Over the substrate there is deposited a dielectric layer 26, electrically insulating spacers 28 and, over the dielectric, a polysilicon gate 30. The FET portion 21 comprises a source-drain region 27 formed by diffusion of p or n dopants into substrate 22, dielectric layer 26, polysilicon gate 30, and electrically insulating spacers 28. Except for the source-drain diffusion, the pull-in electrode and cantilever support have similar structures with a dielectric layer 26, surrounding spacers 28, and doped polysilicon layers 32. The dielectric layers are typically made of silicon dioxide and the spacers are typically of silicon nitride. As shown in the plan view in FIG. 2, the FET 21, pull-in electrode 23, and cantilever support 25 are electrically isolated from one another.

Figure 3:
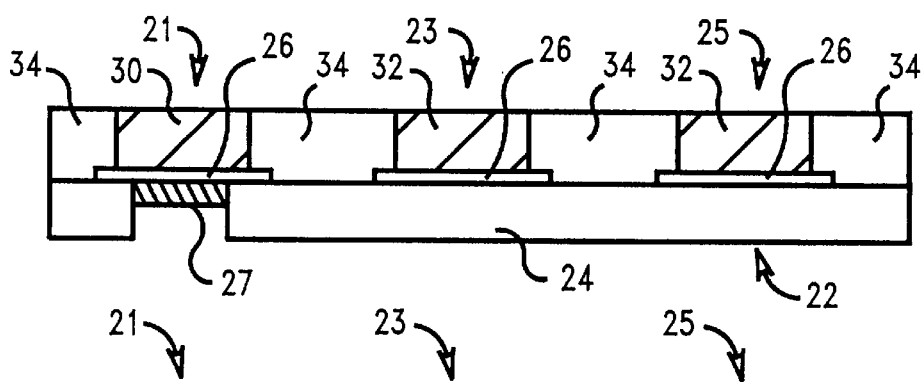
Figure 4:
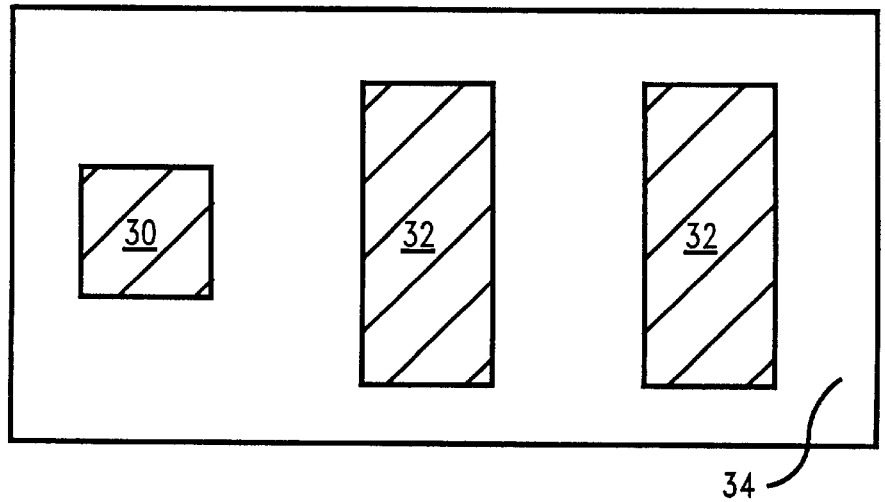

As shown in FIGS. 3 and 4, there is next deposited by plasma deposition techniques a silicon nitride layer 34 of thickness of 300 nm, for example. Conventional chemical mechanical polishing (CMP) is used on the nitride to insure that the nitride layer 34 surface is co-planar with the surface of the polycrystalline silicon 30, 32. Optionally, an oxide cap may be deposited to protect the polycrystalline silicon during chemical mechanical polishing, in which case hydrofluoric acid may be utilized to remove the oxide.

Figure 5:
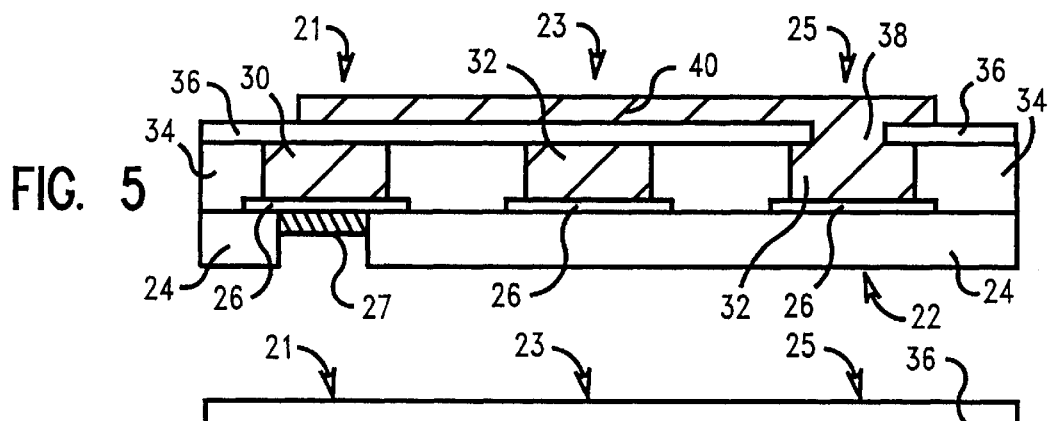
Figure 6:
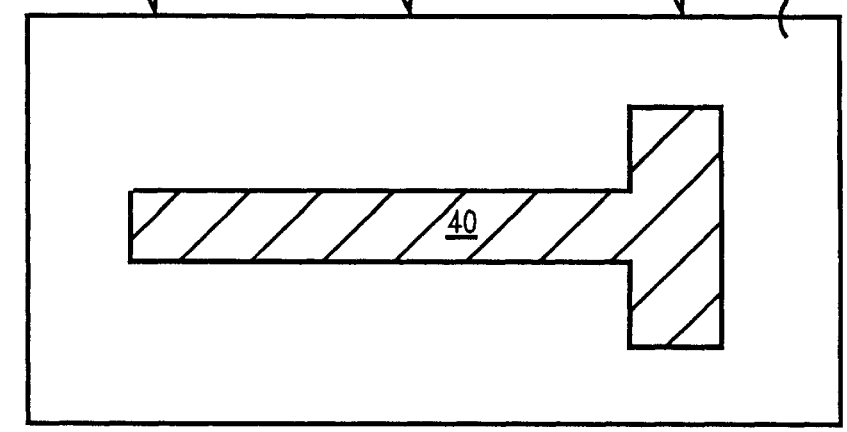

In FIGS. 5 and 6 there is shown the deposition of a thin silicon dioxide layer 36 of thickness of 20 nm, for example. It is important that this oxide layer have a relatively high etch rate in an oxide-specific etchant such as hydrofluoric acid. After patterning and creating a contact hole 38 over the cantilever support region 25, a layer of doped polycrystalline silicon 40 is deposited in, for example, a thickness of 200 nm, to form the electrically conductive cantilever arm. Optionally, the entire structure is heat-treated to anneal it in order to form a good physical and electrical contact with the cantilever support region 25.

Figure 7:
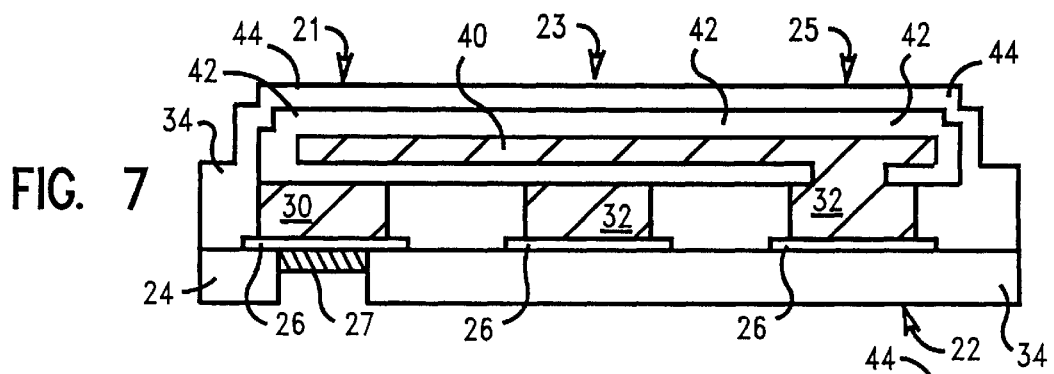
Figure 8:
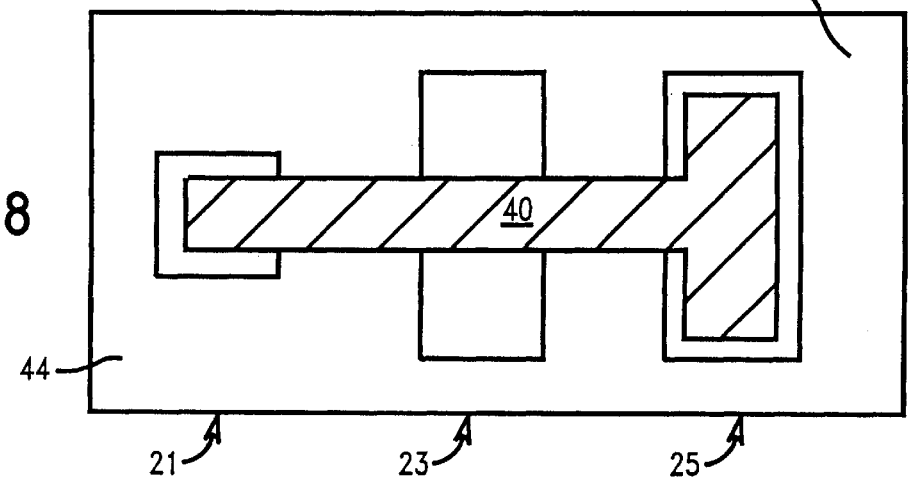

Thereafter, in FIGS. 7 and 8, a thin silicon dioxide layer 42 of, for example, 100 nm thickness is deposited over cantilever arm 40. Again this oxide should have a relatively high etch rate in an oxide-specific etchant such as hydrofluoric acid. Both the oxide layers 36 and 42 are patterned to allow etch to flow easily to the sacrificial oxide regions of the cantilever arm 40. Subsequently, there is deposited a silicon nitride layer 44, which makes contact with nitride layer 34, to form a physically and electrically insulative protective cover over the entire structure previously formed, particularly cantilever arm 40.

Figure 9:
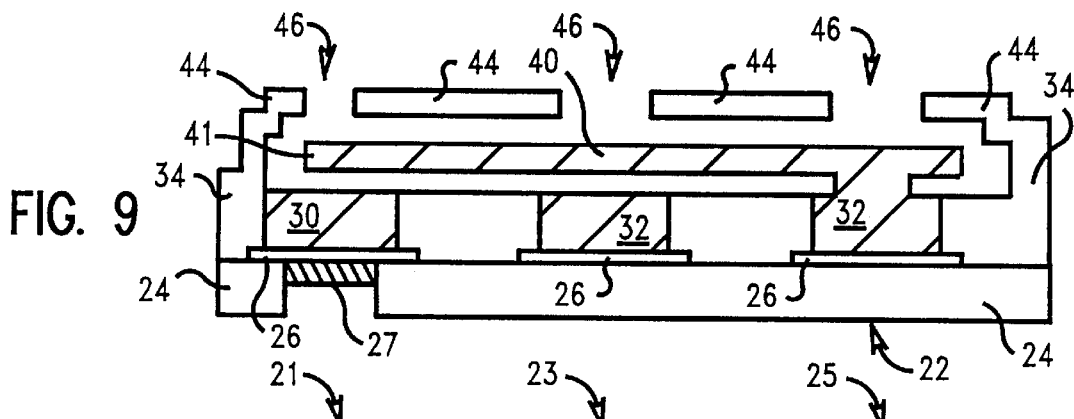
Figure 10:
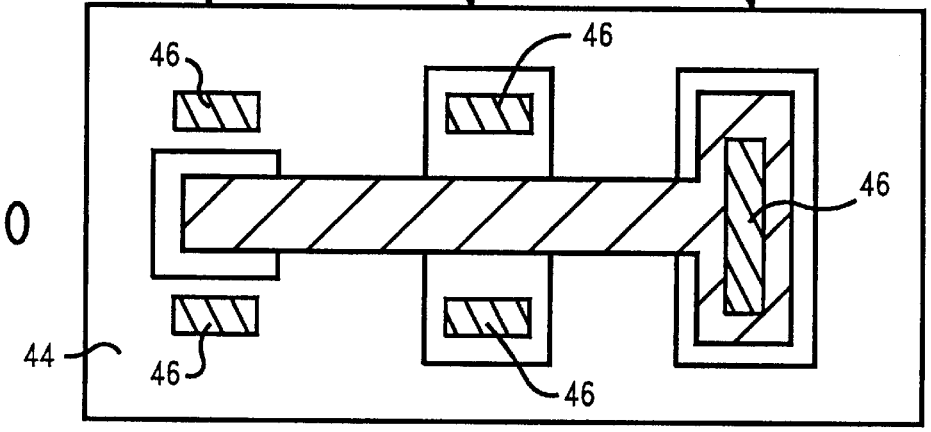

As shown in FIGS. 9 and 10, holes 46 are formed in nitride cover 44 on either side of cantilever arm 40 in the FET 21 and pull-in electrode 23 portions. A hole 46 is also formed directly over the electrode support portion 25. Hydrofluoric acid is then employed to etch the oxide through holes 46 to remove oxide layers 42 and 36 above, below and alongside cantilever arm 40. Following this step, cantilever arm 40 has a free end 41 opposite the end connected to the cantilever support portion 25, which may move up and down, toward and away from FET 21.

Figure 11:
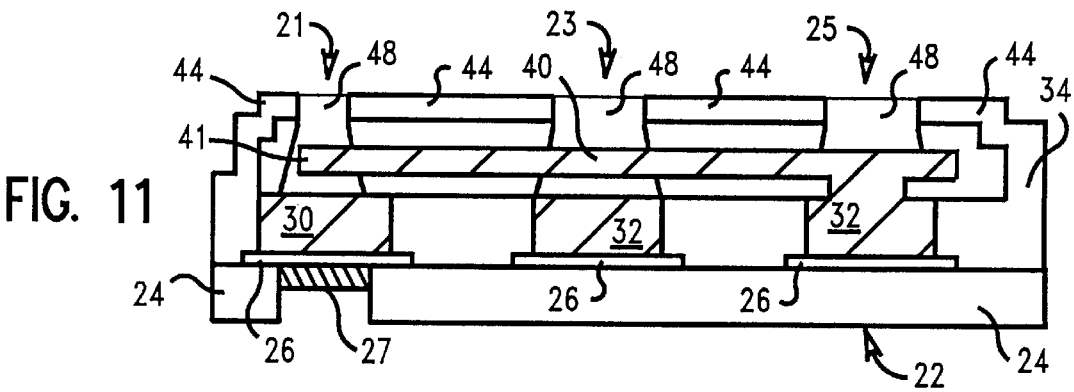
Figure 12:
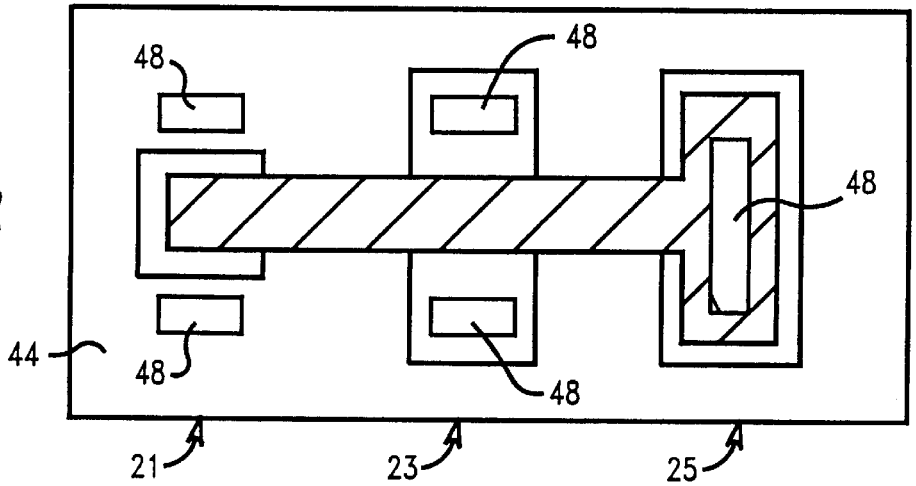

As shown in FIGS. 11 and 12, a directional silicon oxide, for example, a non-conformal sputtered quartz, is introduced through openings 46 in nitride layer 44. This directional oxide 48 plugs only the holes 46 in the immediate vicinity and does not travel under the cantilever arm 40 so as not to impede movement thereof.

Figure 13:
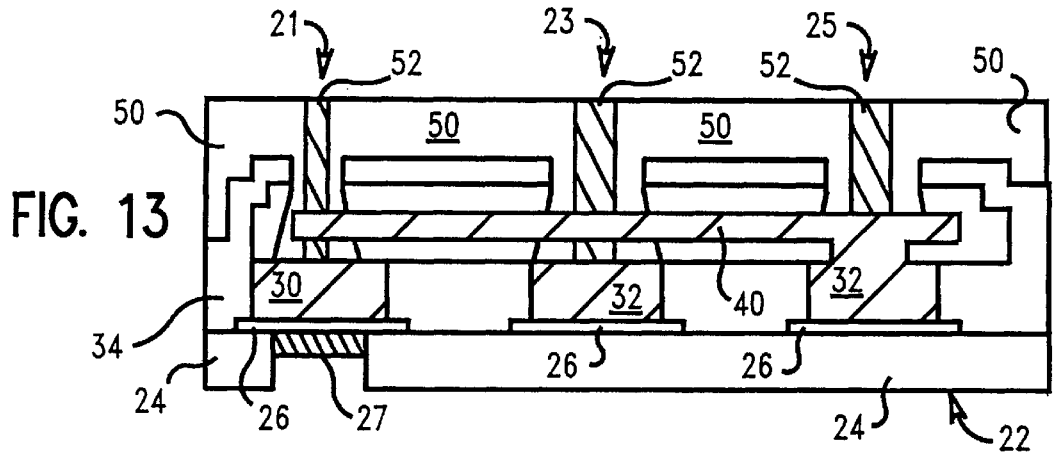
Figure 14:
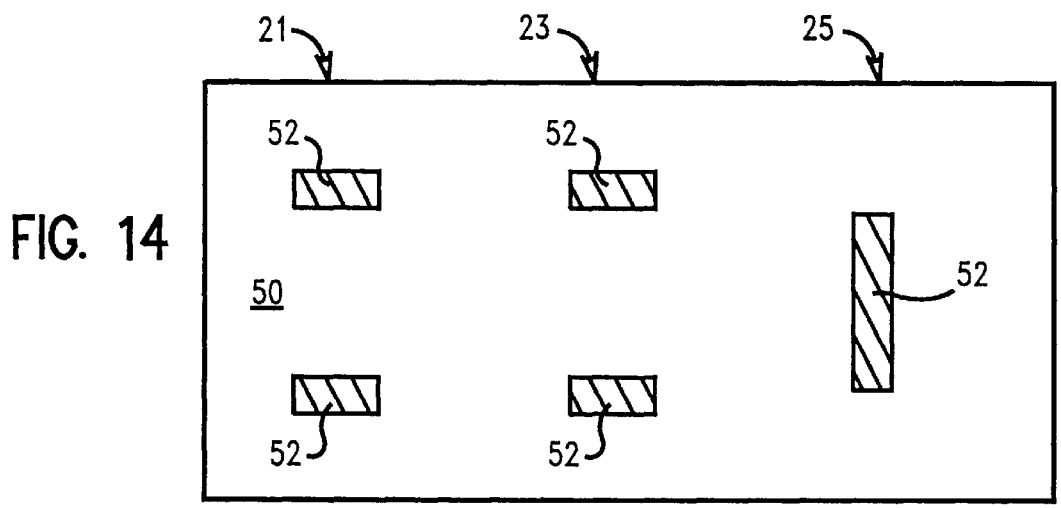

Finally, as shown in FIGS. 13 and 14, a BEOL (back end of the line) passivation layer or interlevel dielectric 50 of silicon dioxide, for example, is applied over the nitride layer 44. Vias are etched at the location of the previously deposited directional oxide 48. Metal vias 52 are deposited to contact the FET 21 pull-in electrode 23 and cantilever support 25 regions. In the case of the FET, the vias contact opposite ends of the source and drain regions.

The finished switch consists of an electrically conductive polysilicon cantilever 40 supported by electrically conductive support 25 which is adapted to be moved by the electrically conductive electrode 23 beneath it. Alternatively, instead of conductive support 25, which could be contacted through additional wiring located in the substrate, current may be applied to cantilever 40 by means other than support 25 such as an electrical conductor in contact with the cantilever at the support end, from the top of the cantilever above support 25. When a bias between the cantilever 40 and the electrode 23 is applied, the cantilever moves downward due to electrostatic attraction by the pull-in electrode. At a high enough bias, the cantilever touches the floating electrode, the MOSFET gate 30, and charges the gate 30 to the cantilever potential. The current through the source-drain region 27 of FET 21 provides the means for sensing the charge state in gate 30. Writing a 1 or 0 is accomplished by swapping the cantilever/pull-in electrode potentials.

All of the fabrication steps described previously are completed after the formation of standard MOSFETS. The use of sacrificial oxide supports the cantilever during fabrication. An oxide-specific etch such as hydrofluoric acid is used to remove the sacrificial oxide above and below the cantilever arm 40. The completed switch is protected from further process steps by a chemical vapor deposition nitride layer 44.

In an alternative configuration, the arrangement of FET 21 and pull-in electrode may be reversed, so that FET 21 is between support 25 and pull-in electrode 23. The cantilever 40 would still contact FET gate 30 in operation.

Figure 15A:
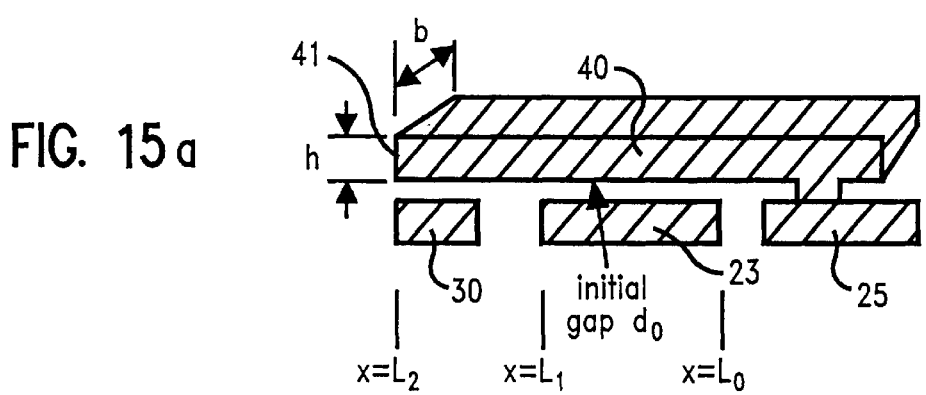
FIG. 15a is a schematic view of the physical configuration of the nonvolatile memory cell of the present invention.
Figure 15B:
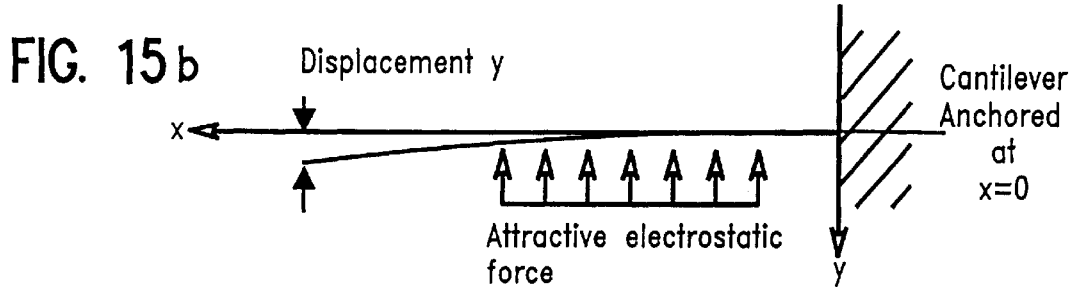
FIG. 15b is a force diagram based on the schematic of FIG. 15.

The operation of the microelectromechanical NVRAM cell can be demonstrated by a calculation of the pull-in voltage necessary to actuate the switch. FIGS. 15a and 15b illustrate relevant switch dimensions. FIG. 15a shows the schematic of the physical relationships of the components of the switch, i.e., cantilever arm 40, FET gate 30, pull-in electrode 23, and cantilever support 25. The thickness of cantilever arm 40 is given by h and the width of the cantilever arm 40 is given by b. The initial gap between the lower side of cantilever arm 40 and the upper surface of FET gate 30 and pull-in electrode 23 is given by $d_0$. The edge of pull-in electrode closest to cantilever support 25 is given as x dimension $L_0$ while the edge of the electrode farthest from the cantilever arm 25, is given as x dimension $L_1$. The edge of FET 21 farthest from cantilever support 25 is given as x dimension $L_2$.

As shown in the force diagram in FIG. 15b, the cantilever is assumed to be anchored at x=0, the lefthand edge of support 25. The electrode arm free end 41 displaces a distance Y and an attractive electrostatic force is spread over the entire surface of pull-in electrode 23.

In the force analysis, it is assumed that the beam is subject to pure bending forces, with no torsional or axial forces, and the beam is a homogenous material that obeys Hooke's law.

The internal energy of the cantilever in the capacitor (U) as a function of position x is given by the equation:

$$U(x) = \frac{1}{2}C(x)V^2 = \frac{1}{2}\frac{\varepsilon_0 A(x)}{d}V^2 = \frac{1}{2}\varepsilon_0 \frac{(x-L_0)b}{d_0-y}V^2$$

where C(x) is the electrostatic capacitance of the cantilever—pull-in electrode, V is the voltage between the electrode and the pull-in electrode, A(x) is the effective area of the cantilever—pull-in electrode capacitor, and $\epsilon_0$ is the dielectric permitivity of free space. It is understood that all physical dimensions can be optimized for a particular circuit specification, performance level, or to reduce parasitic effects. The electrostatic force (F) as a function of position x acting on the cantilever is given by the equation:

$$F(x) = \frac{\partial}{\partial y} U(x) = \frac{\varepsilon_0}{2} \frac{(x - L_0) b V^2}{(d_0 - y)^2}$$

This can be equated with the shear force $V_s$ acting along the length of the cantilever. The shear force ($V_s$) is related to displacement y through the equation:

$$V_s = \frac{dM}{dx} \qquad M = EI \frac{d^2 y}{dx^2}$$

where M is the bending moment, E is Young's Modulus for polysilicon, and I is the area moment of inertia for the cantilever. The position y is given by the equation:

$$\frac{6\varepsilon_0 V^2 (x - L_0)}{E(h^3 (d_0 - y))^2} = \frac{d^3 y}{dx^3}$$

This equation can be solved numerically. The plot of FIG. 16 shows the cantilever displacement for the following conditions:

$L_0$=1.0 microns
$L_1$=3.75 microns
$L_2$=4.75 microns
h=0.2 microns
b=1.0 microns
$d_0$=200 Angstroms
E=1.6E11 n/m$^2$—Young's modulus for polysilicon
Pull-in voltage=2.5 V (assuming a 5 V power supply)

Figure 16:
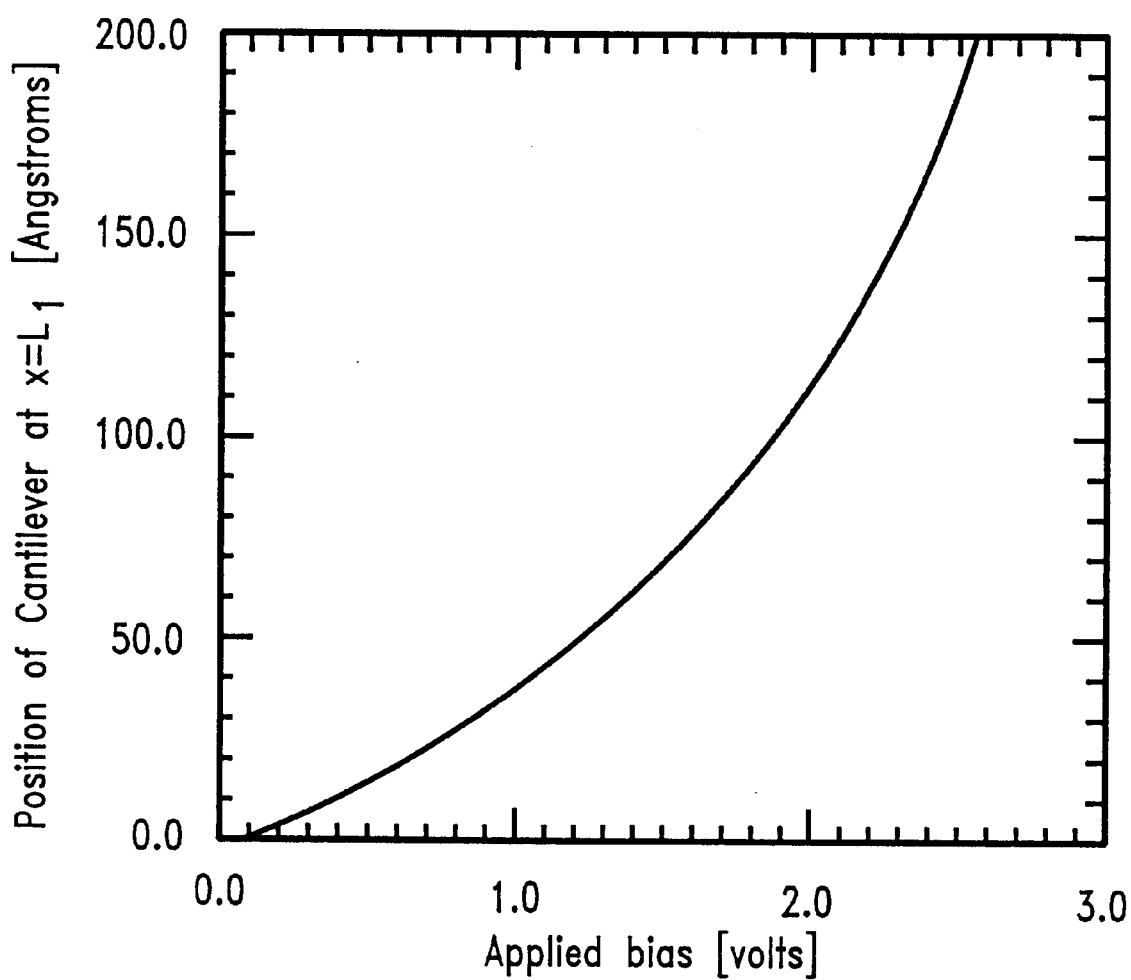
FIG. 16 is a graphical plot of cantilever displacement.

FIG. 16 shows the position versus bias curve for this example set of cantilever dimensions for the nonvolatile memory cell of the present invention. Specifically, the graph of FIG. 16 plots the displacement of the cantilever at x=$L_1$. The actual pull-in voltage will be slightly reduced since contact occurs when the cantilever tip at x=$L_2$ touches the gate and therefore the value of y at pull-in will be $(L_2-L_1)/L_2 * d_0$.

The time to change the state of the MOSFET storage node (RC) includes the time to move the cantilever and make contact with the storage node, the delay in charging the storage node and external wiring delays. The latter factor is neglected for purposes of comparison with conventional NVRAM cells since it is assumed to be the same as a standard dual-poly NVRAM cell.

Cantilever motion time (t) is given by the equation:

$$U_{TOTAL} = \frac{1}{2} m v^2 \Rightarrow v = \sqrt{\frac{2 U_{TOTAL}}{m}} \qquad t = \int \frac{dy}{v}$$

For this calculation, it is assumed that all motion can be considered to be at the center of mass which is approximately half way down the cantilever length.

Using typical dimensions such as those used in the plot of FIG. 16, mass of cantilever, m=(density of polysilicon)× (volume of cantilever)=2.238 kg/um$^3$1×um×0.2 um×4.75 um=2.2×10$^{-15}$ kg The numerical method from the previous calculation can be used to compute the velocity as an implicit function of the pull-in voltage. The calculation below applies to either the read or the write operation for the example conditions cited:

$$t = \int_{cantilver\ unflexed}^{tip\ contact} \frac{dy}{v(x, y)} = 0.7 ns$$

The gate charging time RC may be calculated using the resistance of cantilever=approximately 5 ohms/square×5 squares=25 ohms. The MOSFET gate capacitance ($C_{gate}$) is given by the equation:

$$Cgate = \frac{\varepsilon_{ox}}{t_{ox}} A_{gate} = \frac{3.45 \times 10^{-17} F/\mu m}{1 \times 10^{-2} \mu m} \times 1 \mu m \times 1 \mu m = 3.45 fF$$

Accordingly, intrinsic charging time for the memory cell of the present invention is on the order of picoseconds.

Figure 17:
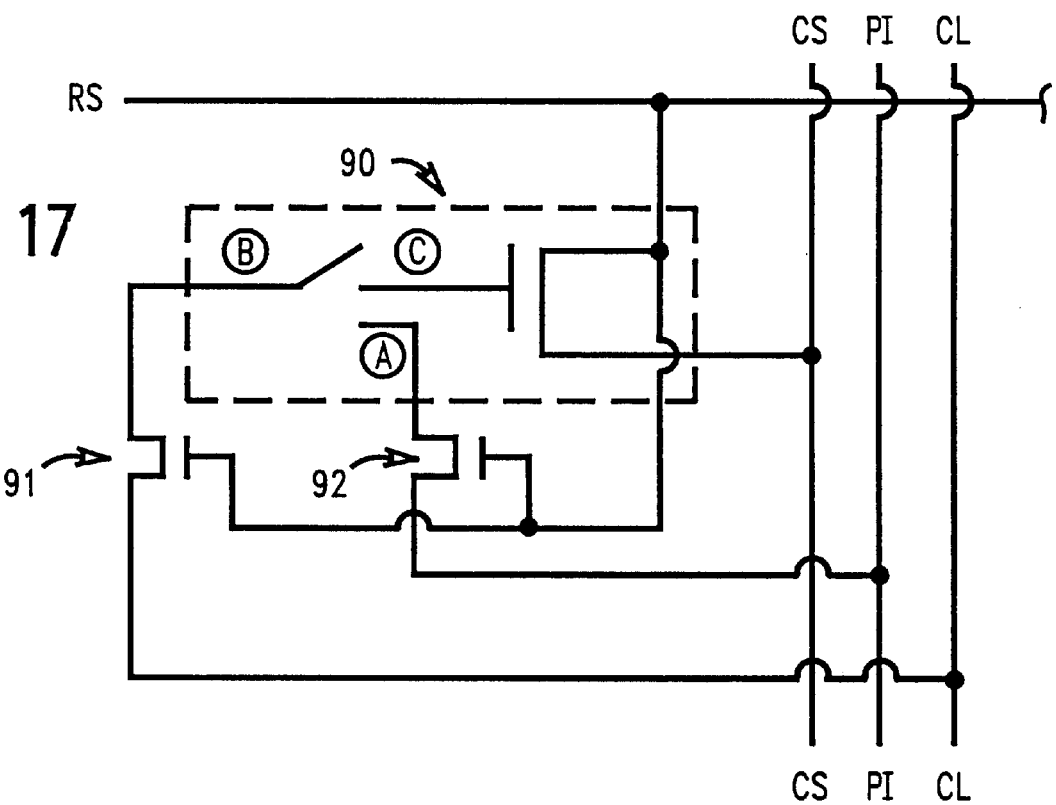
FIG. 17 is a circuit diagram of the memory cell of the present invention.
Figure 18:
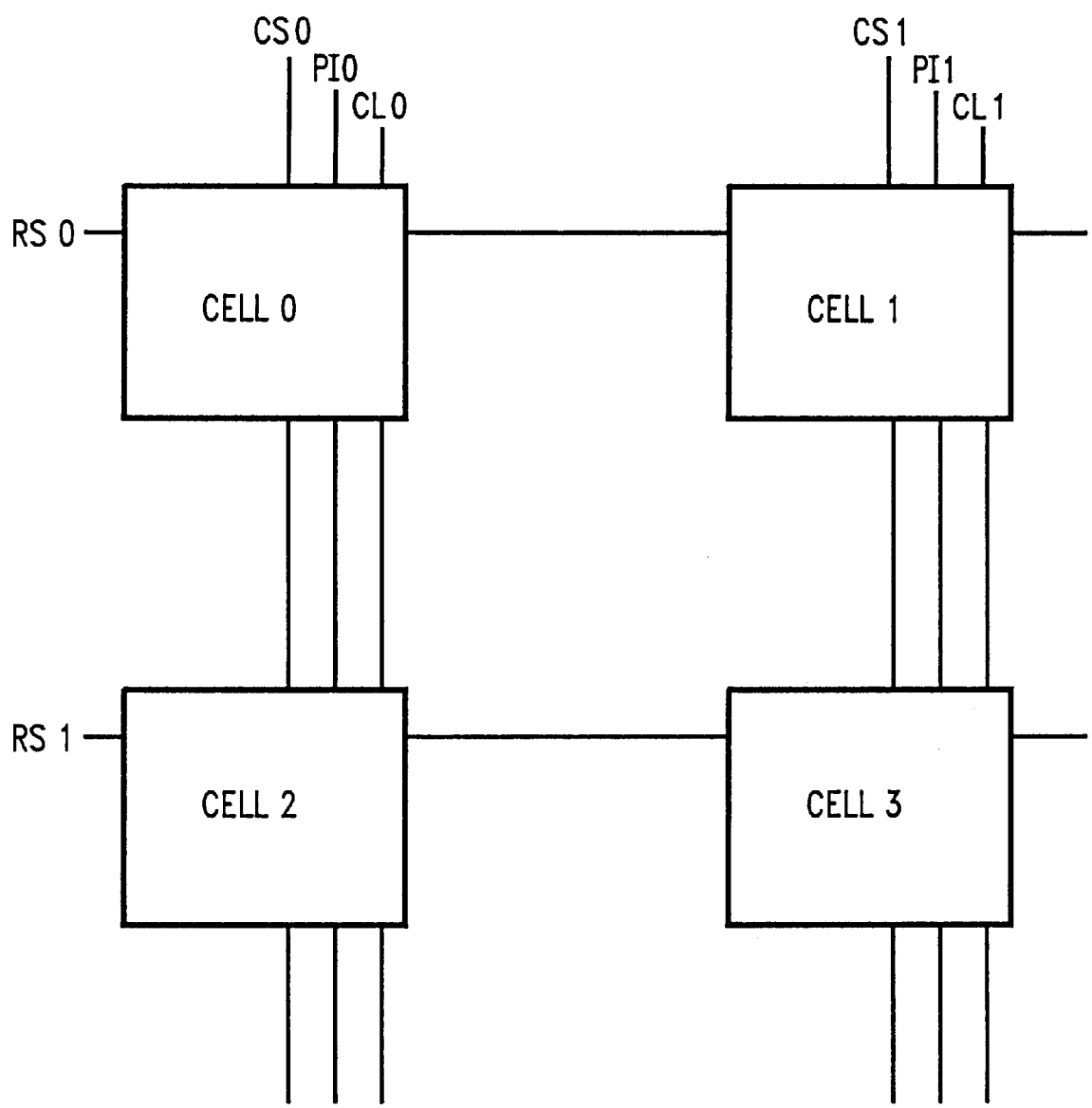
FIG. 18 is a circuit diagram demonstrating an array utilizing the memory cells of the present invention.

A memory cell circuit that uses the microelectromechanical switch of the present invention is shown in FIG. 17. FIG. 18 shows an array of cells connected. The microelectromechanical switch of the present invention is indicated as 90, with A indicating the pull-in electrode 23, B indicating the cantilever 40 and C indicating MOSFET 21. The signal for the pull-in electrode is indicated as PI, the signal for the cantilever is indicated as CL, the signal for the column select is indicated as CS and the signal for the row select is indicated as RS. CS is preferably always held near ground and used as the current sense line which is attached to either the source or drain of the FET 21. A pull-in electrode input (PI) is connected to pull-in electrode A, a cantilever input (CL) is connected to cantilever B. A column select input (CS) and a row select input (RS) are connected to MOSFET C. FET 91 is connected between the cantilever beam B and the cantilever input for controlling the passage of signals. FET 92 is connected between the pull-in electrode A and the pull-in electrode input for controlling the passage of signals. The nonvolatile memory cell is selected by signals applied to the row select input and the column select input. FETs 91 and 92 have gates connected to the row select input. The row select input turns on FET 91 and FET 92 to allow the passage of signals from the pull-in electrode input to the pull-in electrode and from the cantilever input to the cantilever beam when the nonvolatile memory cell is selected. FET 91 and FET 92 are included in the complete NVRAM cell to ensure that unselected cells are not altered when PI and CS are selected. In the present invention all cells in a row of the array are read or written simultaneously with data sensed or provided via column lines PI and CL. Other circuit embodiments using switch 90 are possible.

Figure 19:
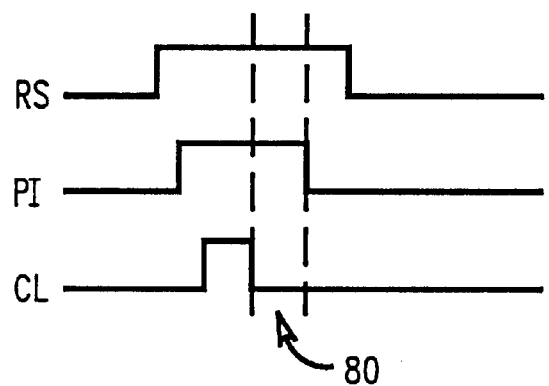
FIG. 19 is a timing diagram for writing of a 0 using the memory cell of the present invention.
Figure 20:
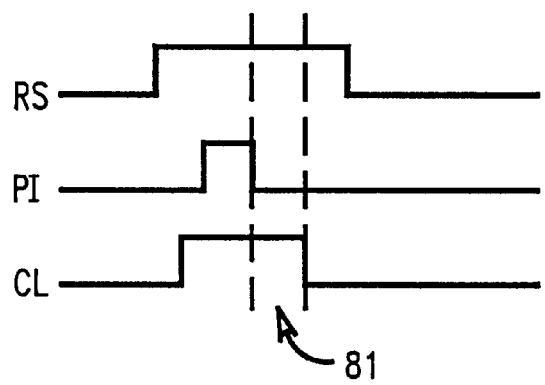
FIG. 20 is a timing diagram for writing of a 1 using the memory cell of the present invention.

As shown in FIGS. 19 and 20, the nonvolatile memory cell is able to write 0 and 1 respectively with the signals shown. Prior to writing the cell, a setup condition is established in a selected cell (RS=1) such that both PI and CL are equal to 1. The state written to the FET gate 30 is the final value of PI when PI and CL have different logical values. The CS line can be read to sense the logical state of the cell. It should be noted that the multiple read/write/verify operations needed by conventional NVRAM cells are not needed in the present invention. Read occurs when RS=1, PI=0 and CL=0. Deselect is when RS=0, PI=0 and CL=0. In FIG. 19, write 0 occurs in region 80 for the signals shown (RS, PI, CL). In FIG. 20, write 1 occurs in region 81 for the signals shown (RS, PI, CL).

Thus the present invention provides a microelectromechanical nonvolatile memory cell which uses an electrostatic switch within FET gate storage node to store a 0 or 1. The present invention is not susceptible to gate oxide degradation as are conventional nonvolatile memory cells. Further, the invention may utilize a single power supply that can be designed to operate at low voltages. The nonvolatile memory cell provides faster write times while having retention times comparable to conventional NVRAM cells. Finally, the nonvolatile memory cell can support write/verify functions by monitoring of the sense current during the write operation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A nonvolatile memory cell comprising:
   an insulating layer fabricated on a substrate;
   an electrically conductive cantilever on said insulating layer, said cantilever supported near a first end thereof and having a second end thereof free for movement;
   an electrical conductor in contact with said cantilever near said first end; and
   a contact region comprising an FET gate on said substrate near said second end of said cantilever, said contact region adapted to receive and store a charge therein when contacted by said second end of said cantilever.

2. The nonvolatile memory cell of claim 1 further including sensing means near said contact region for sensing a charge state of said contact region.

3. The nonvolatile memory cell of claim 2 wherein said sensing means includes a field-effect transistor and said contact region is adapted to act as a gate for the field-effect transistor.

4. The nonvolatile memory cell of claim 3 wherein said field-effect transistor comprises an n-channel field-effect transistor.

5. The nonvolatile memory cell of claim 1 further including an electrode on said insulating layer for causing said cantilever second end to contact said contact region.

6. The nonvolatile memory cell of claim 1 wherein said insulating layer comprises silicon dioxide.

7. The nonvolatile memory cell of claim 1 further including a protective layer over said an insulating layer covering said cantilever and said contact region.

8. The nonvolatile memory cell of claim 7 wherein said protective layer comprises silicon nitride.

9. The nonvolatile memory cell of claim 7 wherein said electrical conductor comprises a support for said cantilever.

10. A nonvolatile memory cell comprising:
    a first conductive element comprising a cantilever beam in a first charge state;
    a second conductive element comprising an FET gate in a second charge state;
    means for bringing the first and second conductive elements into electrical contact to effect a charge state change in one of said first and second conductive elements; and
    means for sensing the charge state in said one of said first and second conductive elements.

11. The nonvolatile memory cell of claim 10 wherein the means for bringing the first and second conductive elements into electrical contact to effect a charge state change comprises an electrode which applies an electrostatic attractive force to said first conductive element.

12. The nonvolatile memory cell of claim 10 wherein the means for sensing the charge state comprises a FET.

13. The nonvolatile memory cell of claim 10 wherein said memory cell is fabricated on a silicon dioxide insulating layer.

14. The nonvolatile memory cell of claim 10 further including a protective layer over said insulating layer covering said first and second conductive elements.

15. The nonvolatile memory cell of claim 14 wherein said protective layer comprises silicon nitride.

16. A nonvolatile memory cell comprising:
    a conductive cantilever beam having a free end in a first charge state;
    a sensing element comprising an FET having a conductive element in a second charge state, said sensing element adapted to sense the charge state in said conductive element; and
    an electrode adapted to bring the cantilever beam into electrical contact with the conductive element to effect a charge state change in said conductive element.

17. The nonvolatile memory cell of claim 16 wherein the cantilever beam is electrically conductive over its entire length.

18. The nonvolatile memory cell of claim 16 wherein the electrode is adapted to apply an electrostatic attractive force to said cantilever beam.

19. The nonvolatile memory cell of claim 16 further including a protective layer over said insulating layer covering said cantilever beam, electrode and sensing element.

20. The nonvolatile memory cell of claim 19 wherein said protective layer comprises silicon nitride.

21. The nonvolatile memory cell of claim 16 wherein said cantilever beam comprises polysilicon.

22. The nonvolatile memory cell of claim 16 wherein said electrode comprises polysilicon.

23. A method of creating and sensing a charge state in a nonvolatile memory cell comprising the steps of:
    a) providing a first conductive element comprising a cantilever beam in a first charge state;
    b) providing a second conductive element comprising an FET gate in a second charge state;
    c) electrically contacting the first and second conductive elements to effect a charge state change in one of said first and second conductive elements; and
    d) sensing the charge state in said one of said first and second conductive elements.

24. A process for fabricating a nonvolatile memory cell comprising the steps of:
    a) providing an insulating layer on a substrate;
    b) creating on said substrate a sensing element, a support and an electrode;
    c) depositing a removable layer over said sensing element, support and electrode;
    d) depositing over said removable, nonconductive layer an electrically conductive layer in contact with said support; and
    e) removing said removable layer such that said electrically conductive layer comprises a cantilever supported by said support and having a movable free end over said sensing element, said sensing element being adapted to receive and store a charge therein when said sensing element is at a predetermined potential and a bias is applied to said electrode to pull said cantilever toward the electrode to cause said free end of said cantilever to contact said sensing element.

25. The process of claim 24 wherein in step (b) said electrode is created between said sensing element and support.

26. The process of claim 24 wherein in step (b) said sensing element is created between said electrode and support.

27. The process of claim 24 wherein step (b) comprises creating on said substrate an FET, a support and an electrode.

28. A nonvolatile memory cell comprising:
  a conductive cantilever beam having a free end in a first charge state;
  a first sensing element comprising an FET having a conductive element in a second charge state;
  a pull-in electrode adapted to bring the cantilever beam into electrical contact with the conductive element to effect a charge state change in said conductive element;
  a pull-in electrode input (PI) connected to said electrode;
  a cantilever input (CL) connected to said cantilever;
  a column select input (CS) connected to said first sensing element;
  a row select input (RS) connected to said first sensing element, the nonvolatile memory cell being selected by signals applied to the row select input and the column select input;
  a second control element connected between said cantilever beam and the cantilever input for controlling the passage of signals from the cantilever input to the cantilever beam; and
  a third control element connected between said pull-in electrode and the pull-in electrode input for controlling the passage of signals from the pull-in electrode input to the electrode.

29. The nonvolatile memory cell of claim 28 wherein the second and third control elements each comprise an FET.

30. The nonvolatile memory cell of claim 28 wherein the second FET and third FET have gates connected to the row select input, the row select input turning on the second FET and the third FET to allow the passage of signals from the pull-in electrode input to the electrode and from the cantilever input to the cantilever beam when the nonvolatile memory cell is selected.

31. The nonvolatile memory cell of claim 28 wherein a one is written to the cell when the cantilever electrode is at a one bias and the pull-down electrode is at a zero bias, and a zero is written to the cell when the cantilever electrode is at a zero bias and the pull-down electrode is at a high bias.

* * * * *